United States Patent [19]
Mizuno

[11] Patent Number: 5,185,646
[45] Date of Patent: Feb. 9, 1993

[54] SEMICONDUCTOR DEVICE WITH IMPROVED CURRENT DRIVABILITY

[75] Inventor: Tomohisa Mizuno, Yokohama, Japan

[73] Assignee: Kabushiki Kaisha Toshiba, Kawasaki, Japan

[21] Appl. No.: 644,510

[22] Filed: Jan. 23, 1991

[30] Foreign Application Priority Data

Jan. 24, 1990 [JP] Japan .................................. 2-14032

[51] Int. Cl.$^5$ ............................................. H01L 29/78
[52] U.S. Cl. ................................... 257/390; 257/622; 257/623; 257/773
[58] Field of Search .................... 357/23.1, 23.4, 23.11, 357/41, 55, 23.6

[56] References Cited

U.S. PATENT DOCUMENTS

| | | | |
|---|---|---|---|
| 4,449,285 | 5/1984 | Janes et al. | 357/23.4 |
| 4,636,825 | 1/1987 | Baynes | 357/23.14 |
| 4,786,953 | 11/1988 | Morie et al. | 357/23.4 |
| 4,816,886 | 3/1989 | Yamazaki | 357/23.4 |
| 4,821,084 | 4/1989 | Kinugasa et al. | 357/23.1 |
| 4,975,754 | 12/1990 | Ishiuchi et al. | 357/23.4 |
| 4,996,574 | 2/1991 | Shirasaki | 357/55 |
| 5,017,977 | 5/1991 | Richardson | 357/55 |

FOREIGN PATENT DOCUMENTS

| | | | |
|---|---|---|---|
| 0348046 | 12/1989 | European Pat. Off. | 357/23.1 |
| 59-204280 | 11/1984 | Japan | 357/23.4 |
| 61-89674 | 5/1986 | Japan | 357/23.4 |
| 63-15467 | 1/1988 | Japan | 357/23.4 |
| 1-035957 | 2/1989 | Japan | 357/23.1 |
| 1-268172 | 10/1989 | Japan | 357/23.4 |
| 2-017675 | 1/1990 | Japan | 357/23.1 |
| 2-79475 | 3/1990 | Japan | 357/23.4 |
| WO89/02655 | 3/1989 | PCT Int'l Appl. | 357/23.4 |

OTHER PUBLICATIONS

IEEE Transactions on Electron Devices, vol. 36, No. 11, Nov. 1989, New York, US. pp. 2605-2606; by Nitayama et al. "High speed and compact CMOS circuits with multipillar surrounding gate transistors".
International Electron Devices Meeting, Dec. 11, 1988, San Francisco, US, pp. 222-225; Takato et al,: "High Performance CMOS surronding gate transistor (SGT) for ultra high density LSIs".
IEEE Transactions on Electron Devices, vol. 38, No. 3, Mar. 1991, "Multi-Pillar Surrounding Gate Transistor (M-SGT) for compact and High Speed Circuits" by Nitayama et al, pp. 579-583.
IEEE Transactions on Electron Devices, vol. 38, No. 3, Mar. 1991, "Impact of Surrounding Gate Transistor (SGT) for Ultra-High-Density LSI's" by Takato et al, pp. 573-577.
Symp. VLSI Tech. Digest, p. 23 (1988), T. Mizuno et al., "High Speed and Highly Reliable Trench MOSFET wtih Dual-Gate".
Japanese Patent Disclosure (Kokai), No. 64-35957, Jul. 20, 1990, T. Mizuno.

Primary Examiner—Rolf Hille
Assistant Examiner—Steven Loke
Attorney, Agent, or Firm—Banner, Birch, McKie & Beckett

[57] ABSTRACT

On a semiconductor substrate are formed a plurality of pedestal regions which are of the same conductivity type as the semiconductor substrate. Insulating layers are formed on side surfaces of the pedestal regions. On the insulating layers are formed gate electrodes which are connected together. First and second regions are formed within top portions of the pedestal regions and the semiconductor substrate. The first and second regions serve as source/drain regions and are of the opposite conductivity type to the semiconductor substrate. The first regions, the second regions and the gate electrodes function to form a single transistor because the gate electrodes are connected together.

18 Claims, 14 Drawing Sheets

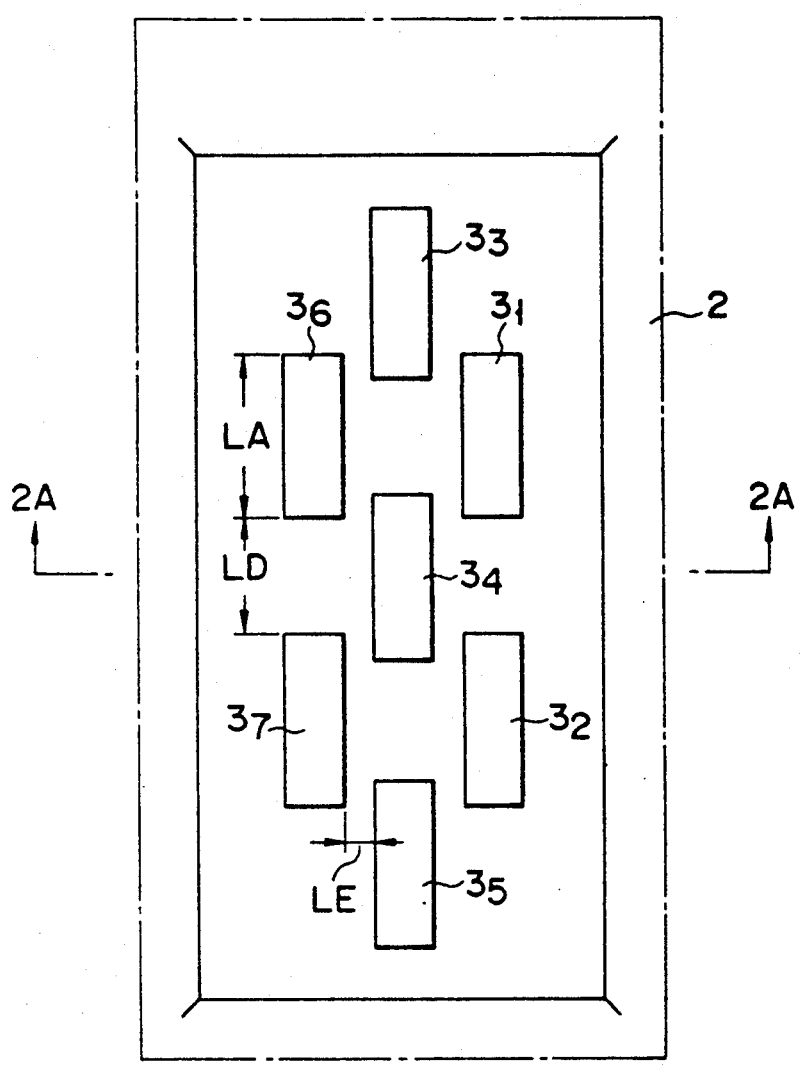
F I G. 1A
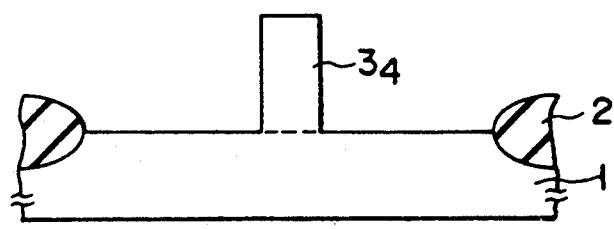
F I G. 2A

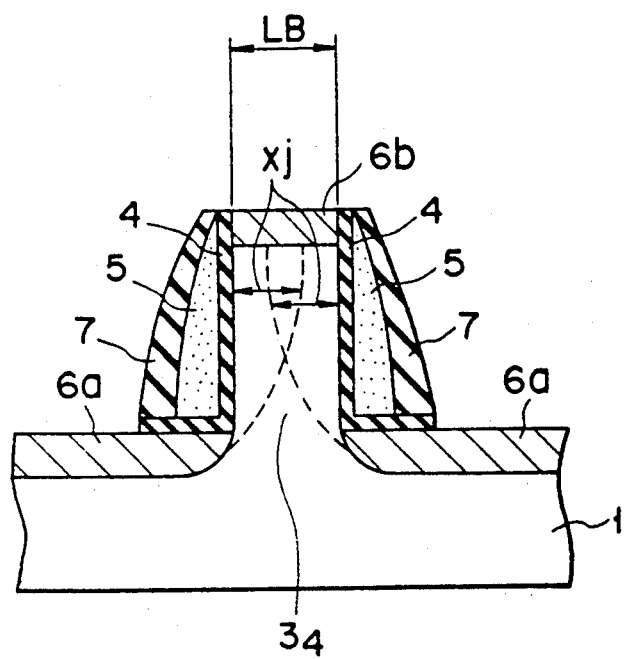
F I G. 2D

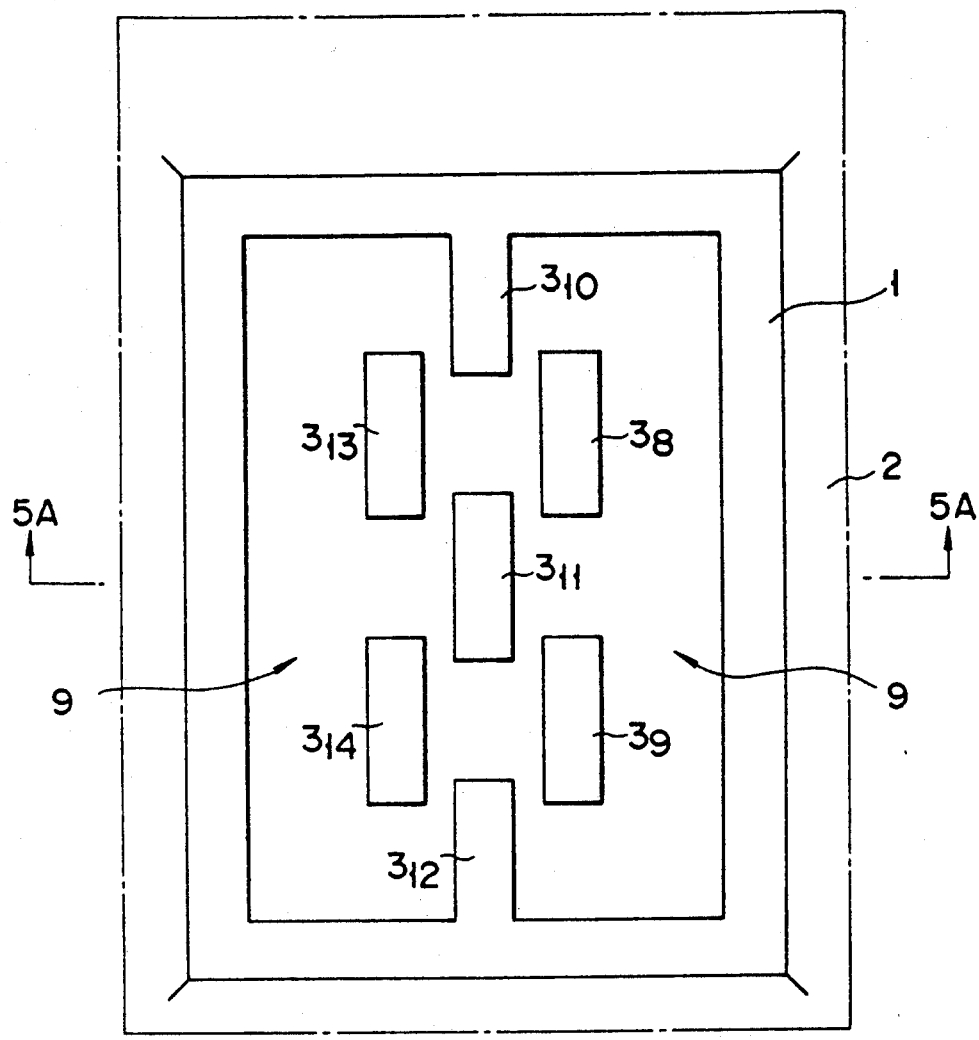
F I G. 4A
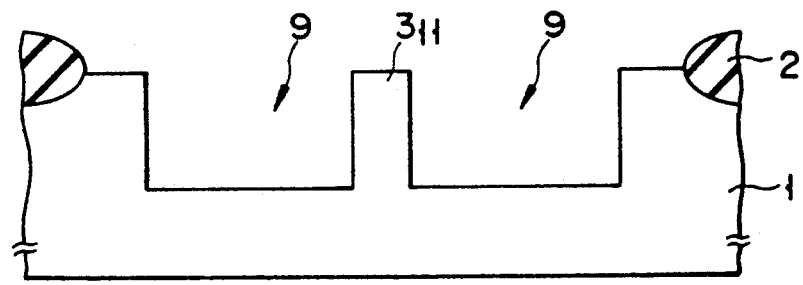
F I G. 5A

SEMICONDUCTOR DEVICE WITH IMPROVED CURRENT DRIVABILITY

BACKGROUND OF THE INVENTION

1. Field of the Invention

The present invention relates to a semiconductor device having an insulated gate transistor, e.g., a MOS transistor and, more particularly, to a semiconductor device with improved current drivability.

2. Description of the Related Art

A conventional MOS-transistor structure will be described with reference to FIGS. 8 and 9. FIG. 9 is a plan view of the conventional MOS transistor and FIG. 8 is a cross-sectional view taken along line 8—8 of FIG. 9.

In FIG. 8, an isolation region 102 is formed on the major surface of a p-type substrate 101. In regions isolated by the isolation region are formed n-type source/drain regions $103_1$ and $103_2$. A gate insulating layer 104 is formed on the channel region between the source/drain regions $103_1$ and $103_2$. A gate electrode 105 is formed on the gate insulating layer 104.

As shown in FIG. 9, the source/drain regions $103_1$ and $103_2$ are formed on both sides of the gate electrode 105. The width L of the gate electrode 105 is called the gate length and the width W of each of the source/drain regions $103_1$ and $103_2$ in the direction normal to the direction of the channel is called the channel width.

Under the condition that $Vd > V_G - V_T$ the current drivability Id of the MOS transistor is expressed by $$Id = (W/2L) \times \mu Cox \, (V_G - V_T)^2 \qquad (1)$$

where L stands for the channel length, W stands for the channel width, $\mu$ stands for mobility, Cox stands for capacitance of the gate insulating layer, and Vd, $V_G$ and $V_T$ stand for a drain voltage, a gate voltage and a gate threshold voltage, respectively.

To produce a MOS transistor requiring great current drivability Id, the channel width W in expression (1) is currently made large. With such an approach, however, an increase of the channel width W results in an increase of the area of the MOS structure, thus making a fine structure of the device difficult.

For this reason, a transistor has been developed in which a pedestal region is provided between source and drain regions to protrude from a semiconductor substrate and a gate electrode is formed on side walls of the pedestal region. This transistor is useful for making the device structure fine, but still it does not have sufficient current drivability.

SUMMARY OF THE INVENTION

It is therefore an object of the present invention to provide a semiconductor device which permits its channel width to be increased for increased current drivability and its integration density to be increased.

The object of the present invention is attained by a semiconductor device with a field effect transistor comprising: a semiconductor substrate having a plurality of pedestal regions each consisting of a first surface, a second surface which differ from said first surface in height and side surfaces connecting said first and second surfaces together; first and second regions formed in said first and second surfaces, respectively, of said semiconductor substrate, said first and second regions serving as source/drain regions and being opposite to said semiconductor substrate in conductivity type; and gate electrodes formed on side surfaces of said pedestal regions and linked together.

According to the present invention, a plurality of pedestal regions are formed in a semiconductor substrate and a plurality of transistors having gate electrodes are formed in side surfaces of the pedestal regions. The transistors function as a single transistor because their gate electrodes are connected together. Therefore, the channel width of one transistor can be increased, thereby providing high current drivability.

In addition, since the gate electrodes are formed on the side surfaces of the pedestal regions, the transistor of the invention permits high-density integration and moreover the channel width to be increased with a small device area.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A, 1B and 1C are plan views, in the order of steps of manufacture, of a MOS transistor with improved current drivability in accordance with a first embodiment of the present invention;

FIGS. 2A, 2B and 2C are cross-sectional views taken along lines 2A—2A, 2B—2B and 2C—2C of FIGS. 1A, 1B and 1C, respectively;

FIG. 2D is a sectional view for use in explanation of a relation between the width of a pedestal region and the width of a depletion layer;

FIGS. 4A, 4B and 4C are plan views, in the order of steps of manufacture, of a MOS transistor with improved current drivability in accordance with a second embodiment of the present invention;

FIGS. 5A, 5B and 5C are cross-sectional views taken along lines 5A—5A, 5B—5B and 5C—5C of FIGS. 4A, 4B and 4C, respectively;

DETAILED DESCRIPTION OF THE PREFERRED EMBODIMENTS

The preferred embodiments of the present invention will be described with reference to accompanying drawings.

As illustrated in FIGS. 1A and 2A, an isolation region 2 is formed on, for example, a p-type substrate 1 by means of, for example, a technique called LOCOS (localized oxidation of silicon). Subsequently, pedestal regions $3_1$ to $3_7$ protruding from the surface of the substrate 1 are formed in rows on a device region 1 by means of, for example, known selective epitaxial growth (SEG). More specifically, the pedestal regions $3_3$ to $3_5$ are arranged at regularly spaced intervals along the row of the pedestal regions $3_1$ and $3_2$ which are also arranged at regularly spaced intervals. The pedestal regions $3_6$ and $3_7$ are also arranged at regularly spaced intervals along the row of the pedestal regions $3_1$ and $3_2$. The rows of pedestal regions have an equal space between adjacent pedestal regions. The space LD between pedestal regions is shorter than the length LA of each pedestal region. The spaced LE between adjacent rows is shorter than the space LD between adjacent pedestal regions.

Figure 1B:
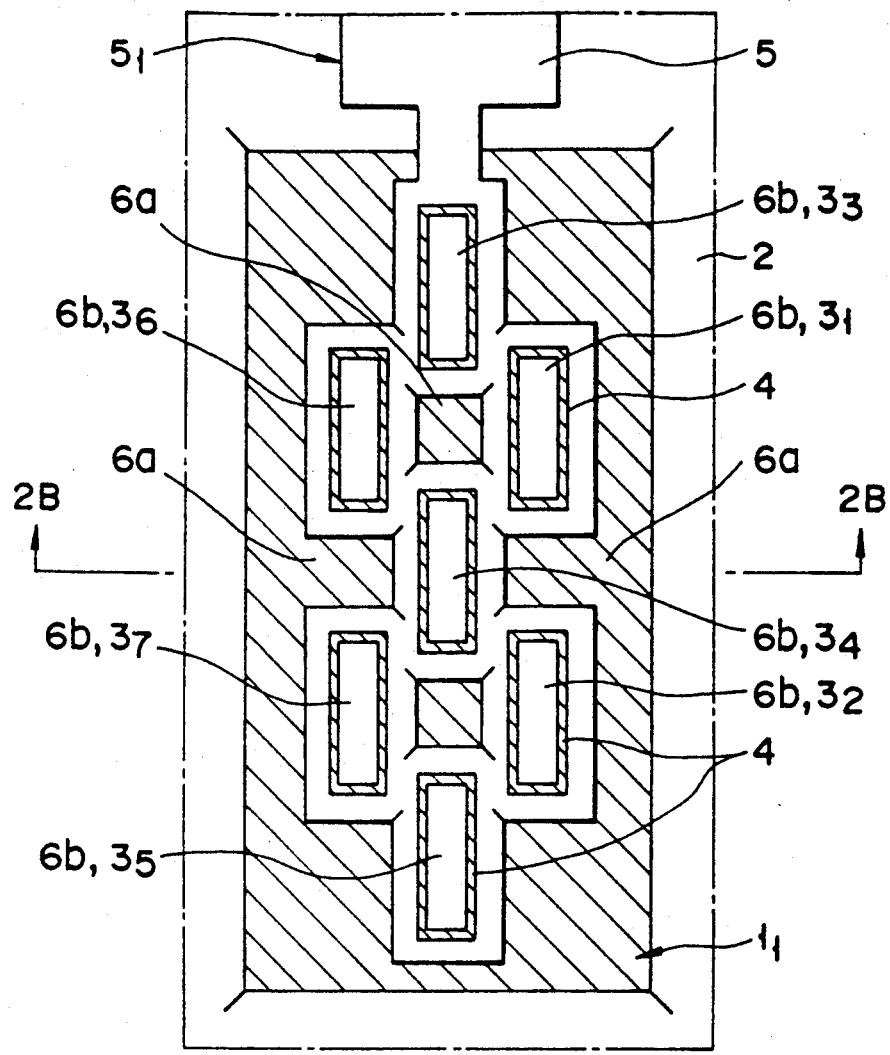
Figure 2B:
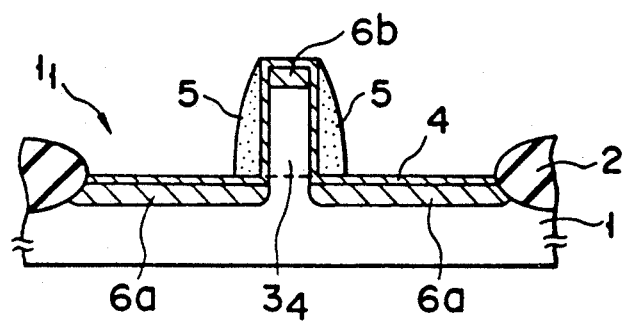

Next, as illustrated in FIGS. 1B and 2B, an oxide layer, serving as a gate insulating layer 4, is formed over the surface of the device region $1_1$ including surfaces of the pedestal regions $3_1$ to $3_7$ by means of, for example, thermal oxidation. In subsequent step, a polysilicon layer is deposited over the entire surface of the resultant structure by means of, for example, chemical vapor deposition (CVD). Subsequently, the polysilicon layer is etched by means of, for example, RIE which is known as an anisotropic etching technique so that it may remain only on side surfaces of the pedestal regions $3_1$ to $3_7$, thereby forming gate electrodes 5. The gate electrodes 5 formed on side surfaces of the pedestal regions $3_1$ to $3_7$ are linked together and serve as a single gate electrode in the device region $1_1$.

Figure 3:
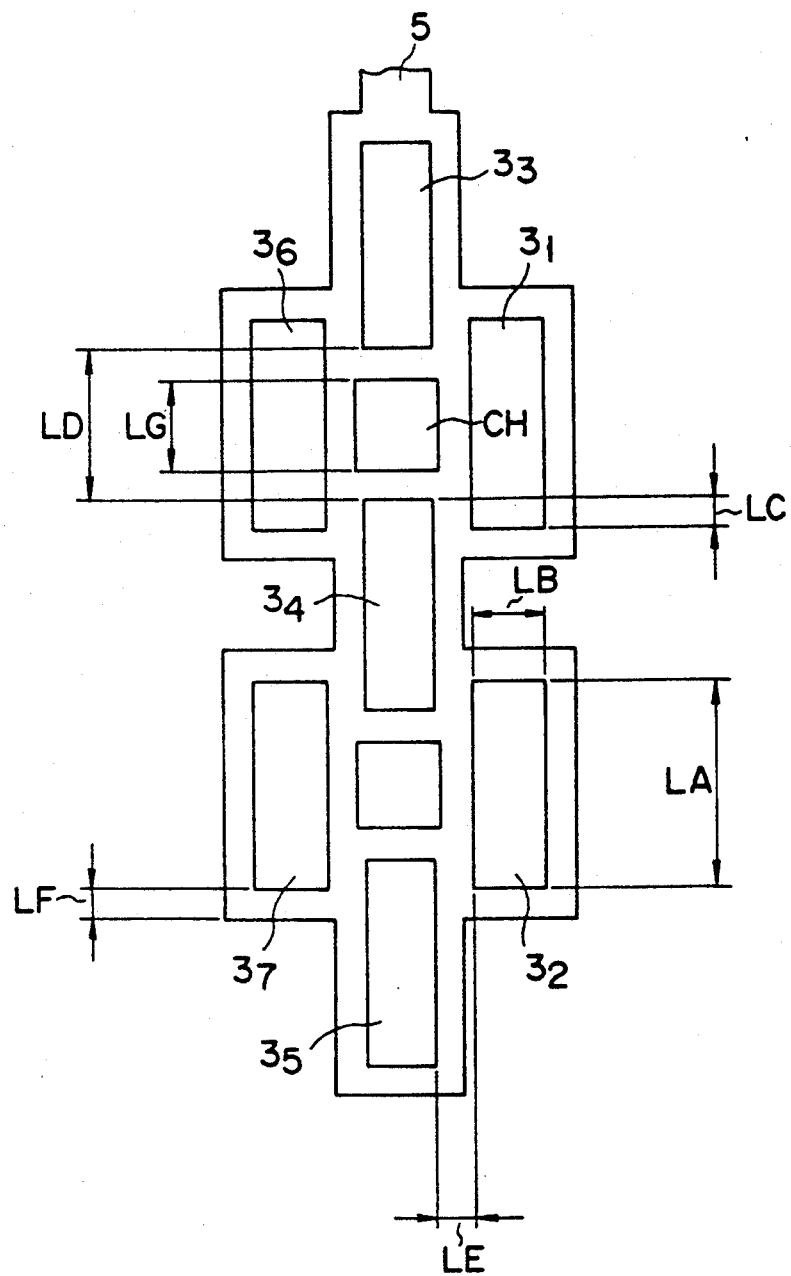
FIG. 3 is a plan view illustrating an exemplary arrangement of pedestal regions.

At this point, a description is made of a method of shaping the gate electrodes 5 into such a form as described above. FIG. 3 is a schematic representation of a plan view of the device in the state of FIG. 1B. First, examples of numeric values of the pedestal regions $3_1$ to $3_7$ will be described. The length LA and width LB of the pedestal regions are about 1.4 μm and 0.5 μm, respectively. The gate insulating layer 4 (not shown in FIG. 3) formed on the surfaces of the pedestal regions has a thickness of about 100 μm and the gate electrode has a thickness LF of about 0.3 μm.

Assuming that the space LE between the rows of pedestal regions is filled up with the gate electrode 5, it may be set to two or less times the thickness LF of the gate electrode 5. Since the thickness LF of the gate electrode 5 is 0.3 μm as described above, the space LE may be 0.6 μm or less. In this embodiment, to ensure a sufficient thickness of the gate electrode 5 on the gate insulating layer 4 between pedestal regions, the space LE is set to be, for example, of the order of 0.5 μm taking some allowance into account.

To form an opening CH, each side of which having a length of LG, among the four pedestal regions $3_1$, $3_3$, $3_4$ and $3_6$, it is required that the space LD between the pedestal regions $3_4$ and $3_3$ arranged in a row be set to at least twice the thickness LF of the gate electrode 5. Since the thickness LF of the gate electrode 5 is 0.3 μm, if the space LD is 1.0 μm, then the length LG of each side of the opening CH will be $$LG = 1.0 - (0.3 + 0.3) = 0.4 \, \mu m$$

Being very thin, the thickness of the gate insulating layer 4 is neglected here.

Since the length LA of each of the pedestal regions $3_1$, $3_3$ and $3_4$ is 1.4 μm, it is required, to secure the spacing LD of 1.0 μm between the pedestal regions $3_3$ and $3_4$, that the length LC of overlap between the pedestal regions $3_1$ and $3_3$ ($3_4$) be $$LC = (1.4 - 1.0)/2 = 0.2 \, \mu m$$

Since a pedestal region in one row overlaps a pedestal region in another row and the space LE between rows of pedestal regions is set to two or less times that the thickness of the gate electrode 5, the space between each of the pedestal regions and the other can be filled up with the gate electrode 5. Thus, the single gate electrode 5 will suffice for the pedestal regions $3_1$ to $3_7$ arranged in rows.

As illustrated in FIG. 1B, a mask formed of, for example, a photo resist may be provided on the polysilicon layer 5 formed on the isolation region 2 to thereby form a contact hole $5_1$.

Subsequently, as illustrated in FIGS. 1B and 2B, n-type impurities of, for example, arsenic, which are opposite in conductivity type to the substrate 1, are implanted into the substrate 1 and top portions of the pedestal regions $3_1$ to $3_7$ using the gate electrode 5 and the isolation region 2 as a mask, whereby source/drain regions $6a$ and $6b$ are formed within the substrate and the top portions of the pedestal regions.

Figure 1C:
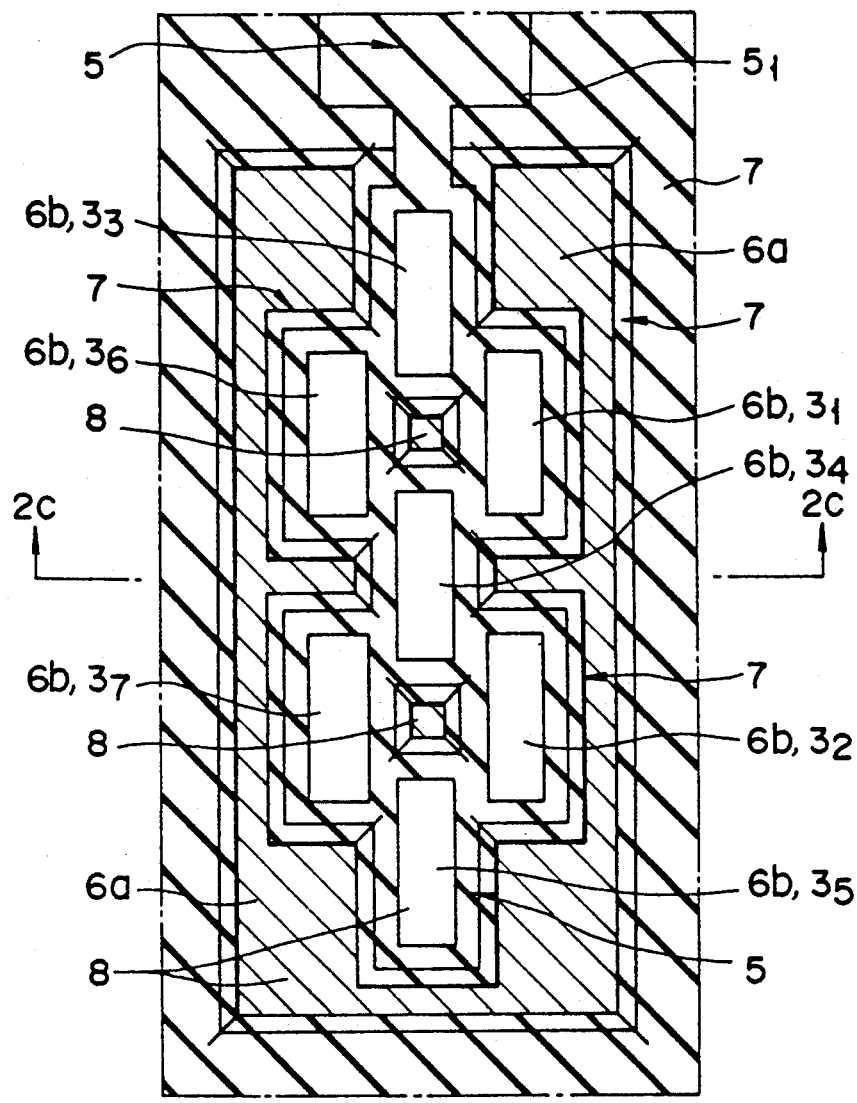
Figure 2C:
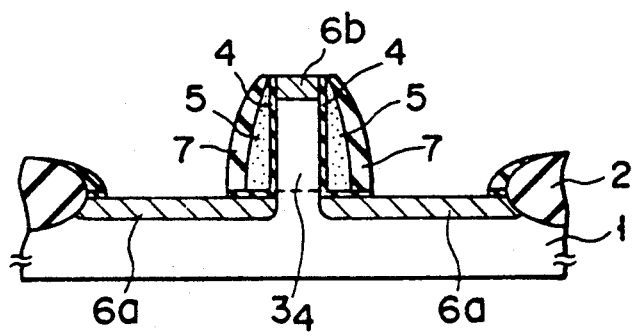

Subsequently, as illustrated in FIGS. 1C and 2C, an oxide layer 7 is formed over the entire surface by means of, for example, CVD. Then, the oxide layer 7 is subjected to anisotropic etching by means of, for example RIE so that the oxide layer is left on the side walls of the pedestal regions. Thus, the gate electrode 5 is insulated from other conductive regions by the oxide layer 7. The removal of the oxide layer 7 to expose the surface of the substrate 1 and the top portions of the pedestal regions $3_1$ to $3_7$ permits contact holes 8 to be formed on a self-alignment basis.

Subsequently, a contact hole (not shown) communicating with the contact area $5_1$ of the gate electrode 5 is formed in the oxide layer 7. Next, a conductive layer which is in contact with the source/drain regions $6a$ and $6b$ is formed and then patterned in accordance with a predetermined wiring pattern, and the entire surface of the resultant structure is covered with a surface protective film, whereby a MOS transistor with high current drivability is produced.

There is a possibility that source connection and drain connection are short-circuited in forming conductive layers for connection not shown. Where the use of one conductive layer is difficult for connection, multi-layer interconnection using two conductive layers may be employed.

The channel region of the MOS transistor according to the first embodiment is formed of the inside side walls of the pedestal regions $3_1$ to $3_7$. The MOS transistor may operate with the diffusion layers $6a$ within the semiconductor substrate 1 as source/drain and the diffusion layers $6b$ of the pedestal regions $3_1$ to $3_7$ as drain/source or with one of the diffusion layers $6a$ as source, the other as drain and the diffusion layers $6b$ of the pedestal regions as a conductive portion for channel-to-channel connection.

In FIG. 3, the channel width W of one pedestal region is given by $$W = 2(LA + LB)$$

In the present embodiment, there are plural pedestal regions in one device region. Assuming the number of the pedestal regions to be n, then the channel width W per device will be $$W = 2n(LA + LB)$$

Moreover, according to the present embodiment, the minimum spacing LE between rows of the pedestal regions is selected to be two or less times that the thickness LF of the gate electrode 5 and the pedestal regions in the central row overlap the pedestal regions in other rows, thereby permitting a single gate electrode 5 to connect all of the pedestal regions together.

As illustrated in FIG. 2D, a depletion layer is produced within the pedestal region by the gate electrode. By relating the width xj of the depletion layer and the width LB of the pedestal region such that $LB \leq 2xj$, it becomes possible to prevent the device area from increasing and produce a MOS transistor having high current drivability.

The gate bias and impurity concentration of the MOS transistor constructed as described above are, for example, 3V, $1 \times 10^{16}$ cm$^{-3}$, respectively.

Figure 4B:
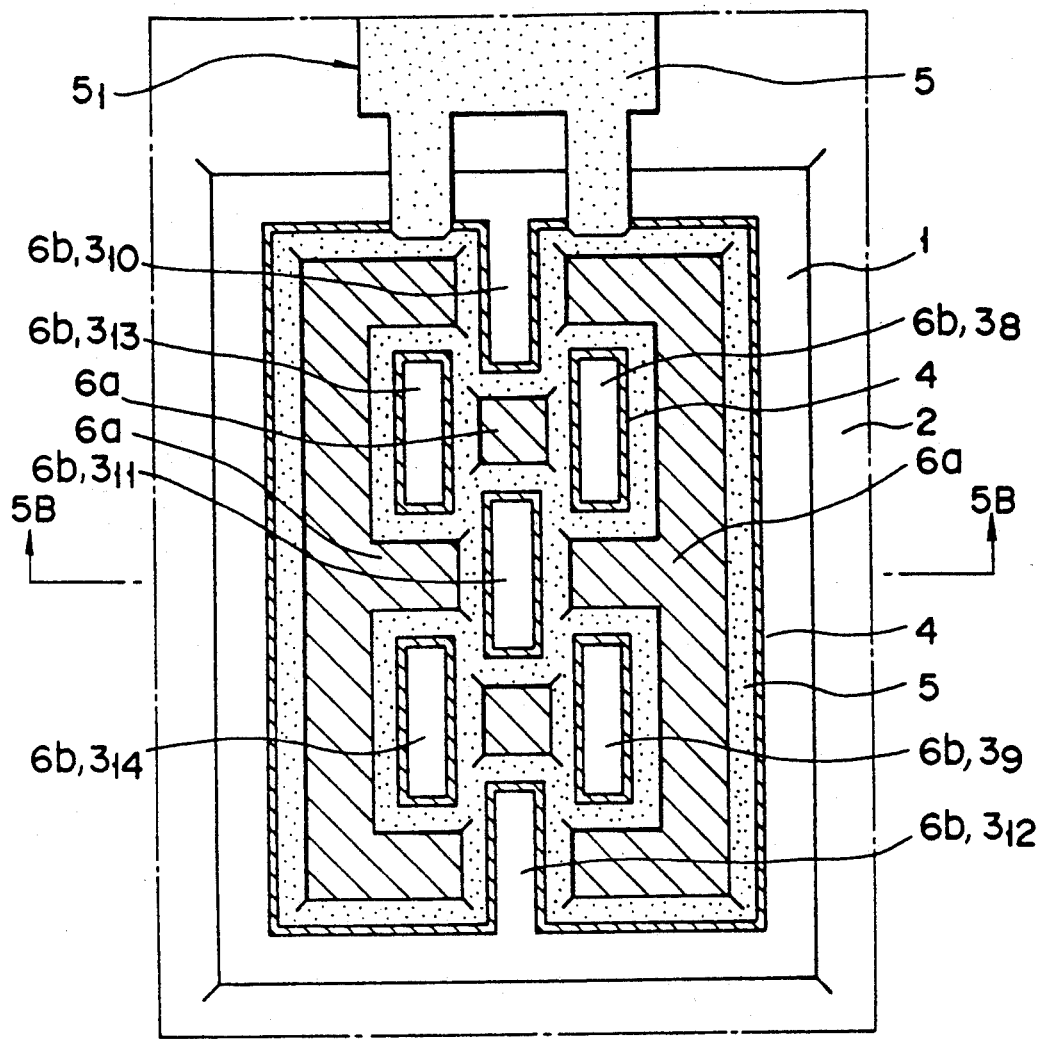
Figure 5B:
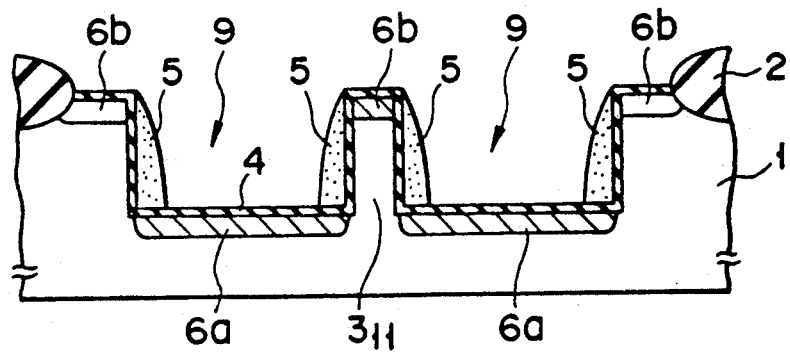
Figure 4C:
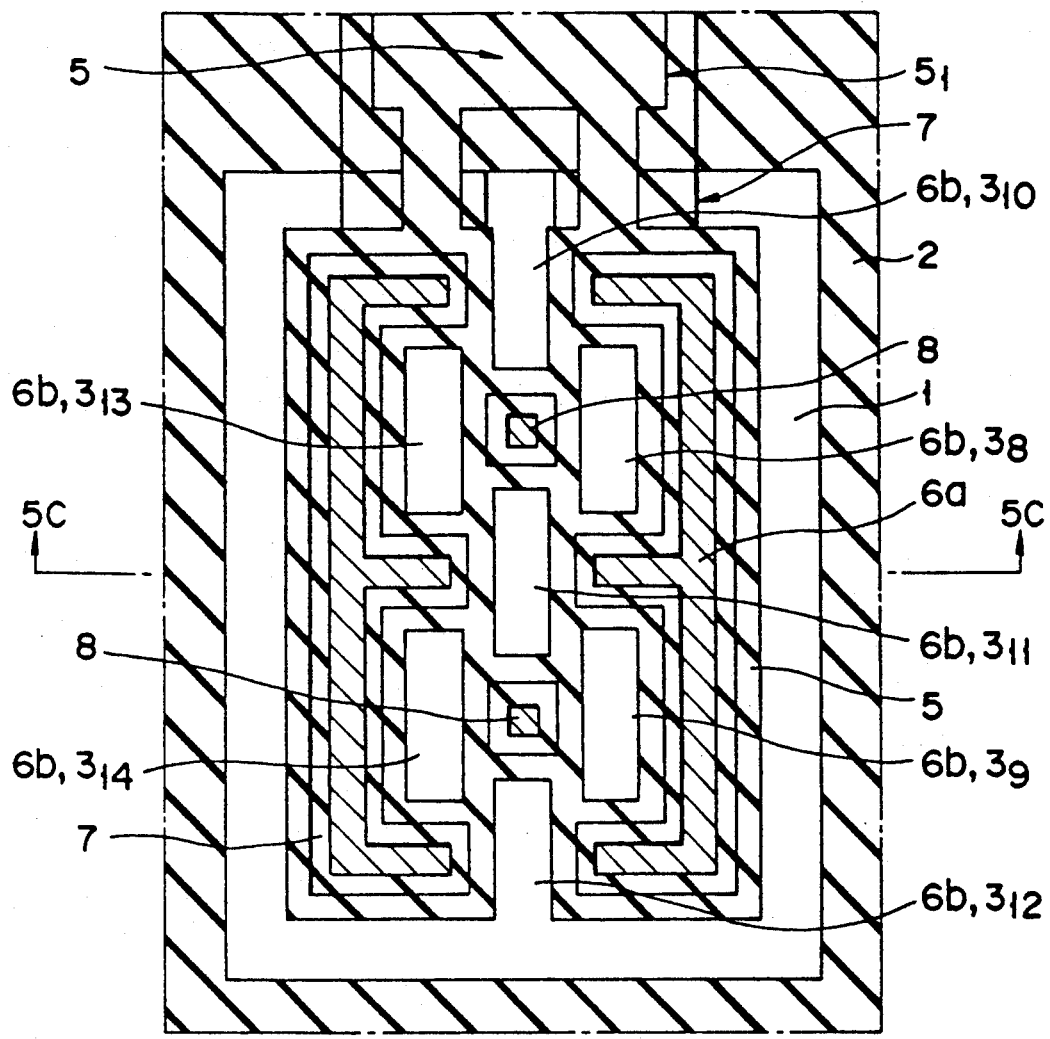
Figure 5C:
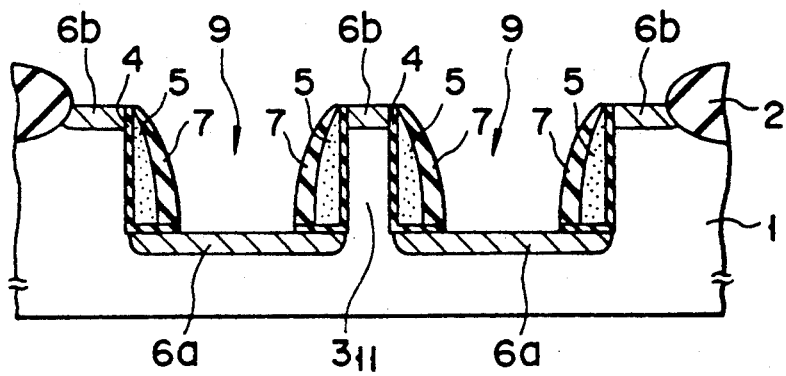

FIGS. 4A, 4B and 4C are plan views, in the order of steps of manufacture, of a semiconductor device according to a second embodiment of the present invention and FIGS. 5A, 5B and 5C are cross-sectional views of FIGS. 4A, 4B and 4C. Like reference characters are used to designate corresponding parts to those in the first embodiment.

As illustrated in FIGS. 4A and 5A, an isolation region 2 is formed on the major surface of, for example, a p-type substrate 1 by means of, for example, LOCOS. Next, a concavity 9 is formed within the substrate 1 by means of a photoetching method using a photo resist. At this time, the substrate 1 is selectively etched so that pedestal regions $3_8$ to $3_{14}$ protruding from the bottom of the concavity 9 are formed. As shown, the pedestal regions $3_{10}$ to $3_{12}$ are arranged at regularly spaced intervals along the pedestal regions $3_8$ and $3_9$ at regularly spaced intervals, and moreover the pedestal regions $3_{13}$ and $3_{14}$ are arranged at regularly spaced intervals along the pedestal regions $3_{10}$ to $3_{12}$. The pedestal regions $3_8$ to $3_{14}$ are arranged in substantially the same relation as in the first embodiment.

As illustrated in FIGS. 4B and 5B, an oxide layer serving as a gate insulating layer is subsequently formed over the surface of the device region including the surfaces of the pedestal regions by means of, for example, thermal oxidation. Subsequently, onto the entire surface of the resultant structure is deposited by means of, for example, CVD a polysilicon layer which is then subjected to anisotropic etching by means of, for example, RIE to leave it on side walls of the pedestal regions $3_8$ to $3_{14}$ and concavity 9, thereby forming gate electrodes 5. In the second embodiment as well, the area between each of the pedestal regions and another is filled up with the gate electrodes 5 as in the first embodiment. The gate electrodes 5 formed on the side walls of the pedestal regions $3_8$ to $3_{14}$ and concavity 9 are connected together to serve as a single gate electrode in the device region.

As illustrated in FIG. 4B, a mask formed of, for example, a photo resist may be provided on the polysilicon layer 5 formed on the isolation region 2 to thereby form a contact hole $5_1$.

Subsequently, n-type impurities of, for example, arsenic, which are opposite in conductivity type to the substrate 1 are implanted into the substrate 1 and the pedestal regions $3_8$ to $3_{14}$ using the gate electrode 5 and the isolation region 2 as a mask, whereby source/drain regions 6a and 6b are formed within the substrate portion as the bottom of the concavity, the substrate portion between the isolation region and the concavity and the top portions of the pedestal regions.

Subsequently, as illustrated in FIGS. 4C and 5C, an oxide layer 7 is formed over the entire surface of the resultant structure by means of, for example, CVD and the resultant oxide layer is subsequently subjected to anisotropic etching by means of, for example, RIE so that the oxide layer is left on the side walls of the pedestal regions $3_8$ to $3_{14}$ and the concavity 9. At this time the electrode 5 extending from the substrate 1 to the isolation region 2 is covered with the oxide layer 7 so that it is not exposed. Thus, the gate electrode 5 is insulated from other conductive regions. The removal of the oxide layer 7 to expose the surface of the substrate 1 and the surfaces of the pedestal regions $3_8$ to $3_{14}$ permits contact holes 8 to be formed on a self-alignment basis.

Subsequently, a contact hole (not shown) communicating with the contact area $5_1$ of the gate electrode 5 is formed in the oxide layer 7. Next, a conductive layer which is in contact with the source/drain regions 6a and 6b is formed and then patterned in accordance with a predetermined wiring pattern. Subsequently, the entire surface of the resultant structure is covered with a surface protective film, whereby a MOS transistor according to the second embodiment is produced.

As with the first embodiment, the second embodiment can also prevent the device area from increasing and produce a MOS transistor having high current drivability.

Figure 6A:
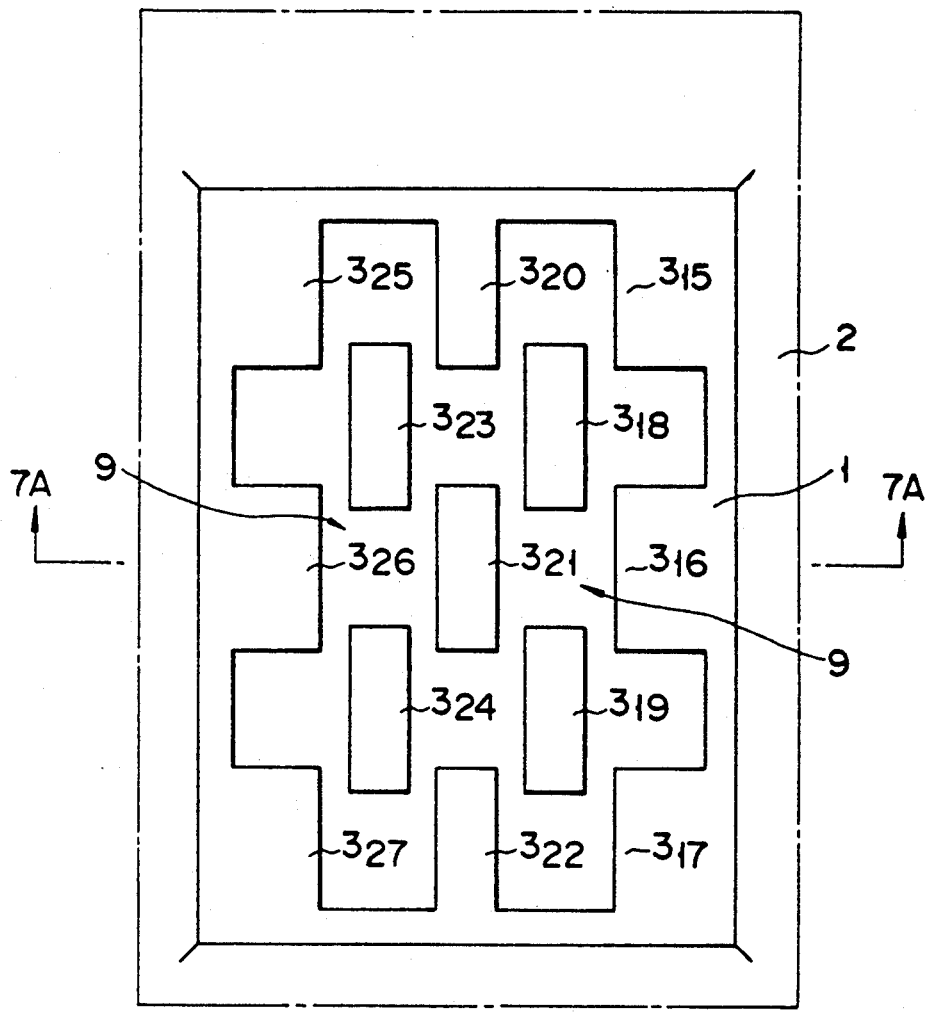
FIGS. 6A, 6B and 6C are plan views, in the order of steps of manufacture, of a MOS transistor with improved current drivability in accordance with a third embodiment of the present invention.
Figure 7A:
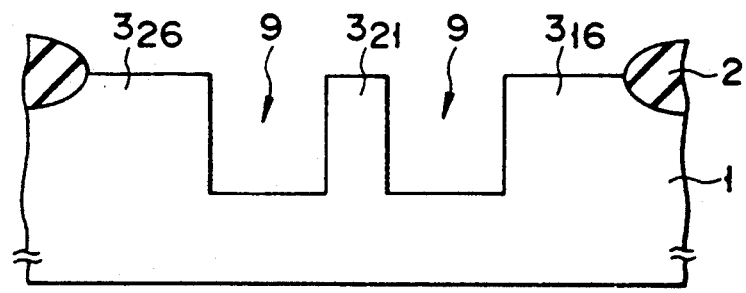
FIGS. 7A, 7B and 7C are cross-sectional views taken along lines 7A—7A, 7B—7B and 7C—7C of FIGS. 6A, 6B and 6C, respectively.
Figure 6B:
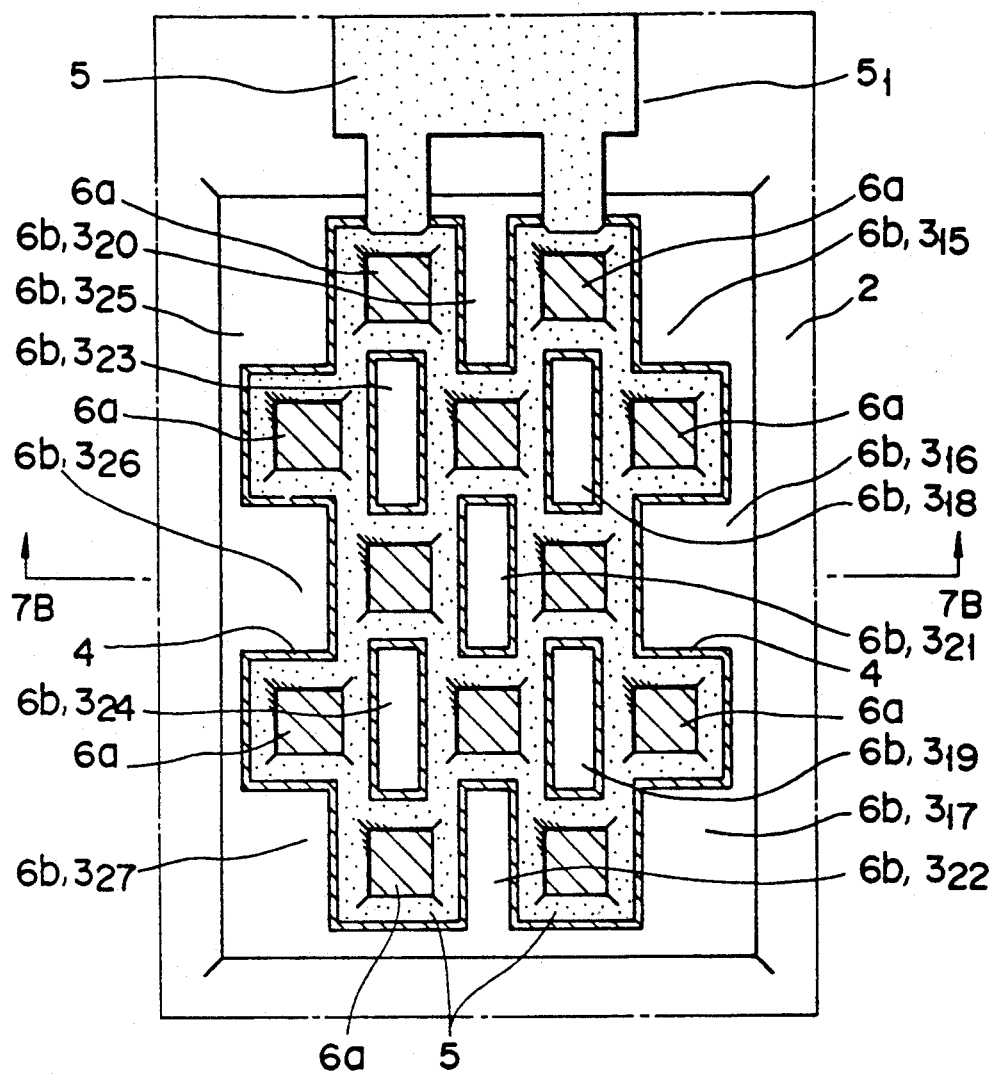
Figure 7B:
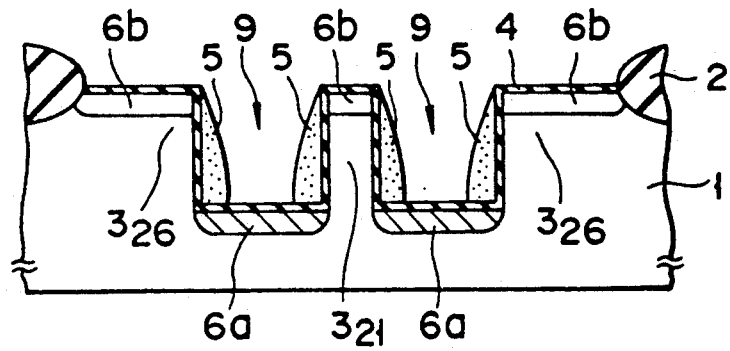
Figure 6C:
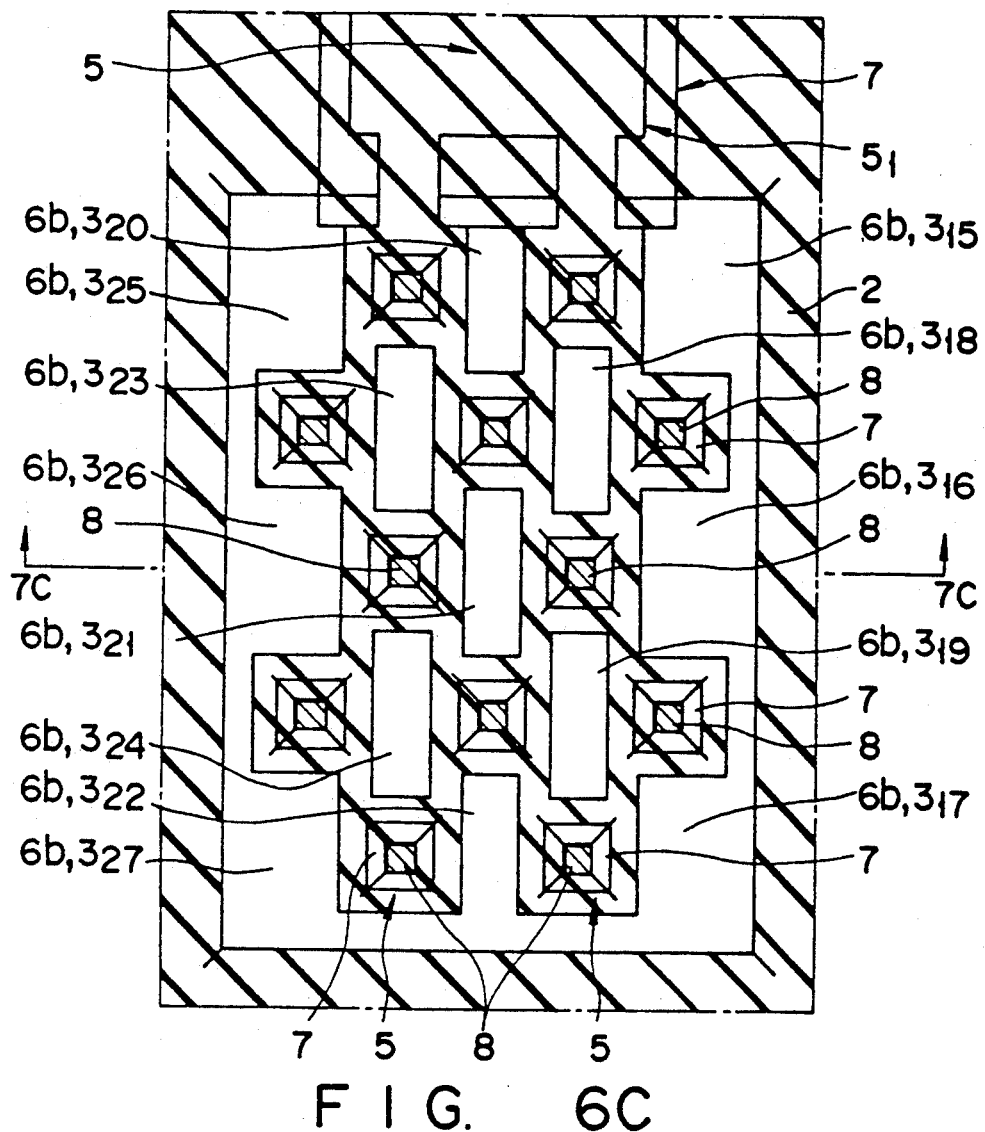
Figure 7C:
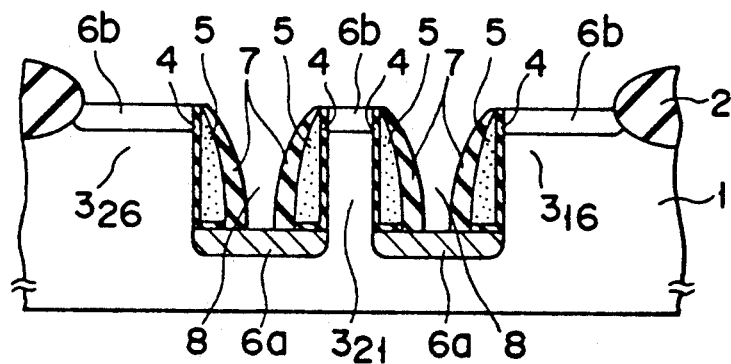

FIGS. 6A, 6B and 6C are plan views, in the order of steps of manufacture, of a semiconductor device according to a third embodiment of the present invention, and FIGS. 7A, 7B and 7C are cross-sectional views of FIGS. 6A, 6B and 6C. Like reference characters are used to designate corresponding parts to those in the first embodiment.

As illustrated in FIGS. 6A and 7A, an isolation region 2 is formed on the major surface of, for example, a p-type substrate 1 by means of, for example, LOCOS. Next, a concavity 9 is formed in the substrate 1 by means of a photoetching method using, for example, a photo resist. At this time, the substrate 1 is selectively etched so that pedestal regions $3_{15}$ to $3_{27}$ protruding from the bottom of the concavity 9 are formed. Of the pedestal regions $3_{15}$ to $3_{27}$ the regions $3_{15}$, $3_{16}$, $3_{17}$, $3_{20}$, $3_{22}$, $3_{25}$ and $3_{27}$ are integral with the side walls of the substrate 1. As shown, the pedestal regions $3_{15}$, $3_{16}$ and $3_{17}$ are arranged at regularly spaced intervals. The pedestal regions $3_{18}$ and $3_{19}$ are arranged along the pedestal regions $3_{15}$ to $3_{17}$. The spacing between the pedestal regions $3_{18}$ and $3_{19}$ is equal to that in the row of the pedestal regions $3_{15}$ to $3_{17}$. The pedestal regions $3_{20}$ to $3_{22}$, pedestal regions $3_{23}$ and $3_{24}$ and pedestal regions $3_{25}$ to $3_{27}$ are arranged at regu-larly spaced intervals as with the pedestal regions $3_{15}$ to $3_{19}$.

As illustrated in FIGS. 6B and 7B, an oxide layer serving as a gate insulating layer 4 is subsequently formed over the surface of the device region including the surfaces of the pedestal regions $3_{15}$ to $3_{27}$ by means of, for example, thermal oxidation. Subsequently, a polysilicon layer serving as gate electrode 5 is deposited onto the entire surface of the resultant structure by means of, for example, CVD. The polysilicon layer is then subjected to anisotropic etching by means of, for example, RIE so that it is left on side walls of the pedestal regions $3_{15}$ to $3_{27}$, thereby forming gate electrodes 5. The gate electrodes 5 formed on the side walls of the pedestal regions $3_{15}$ to $3_{27}$ are all connected together to serve as a single gate electrode in the device region. In the third embodiment as well, the area between each of the pedestal regions and another is filled up with the gate electrode 5 as in the first and second embodiments. The gate electrode 5 may be formed in the same manner as the first embodiment.

As illustrated in FIG. 6B, the polysilicon layer 5 formed on the isolation region 2 may be masked by, for example, a photo resist to form a contact hole 51.

Subsequently, n-type impurities of, for example, arsenic, which are opposite in conductivity type to the substrate 1 are implanted into the substrate 1 and top portions of the pedestal regions $3_{18}$ to $3_{24}$ using the gate electrode 5 and the isolation region 2 as a mask, whereby source/drain regions 6a and 6b are formed within the substrate portion as the bottom of the concavity, the substrate portion between the isolation region 2 and the concavity 9 and the top portions of the pedestal regions $3_{18}$ to $3_{24}$.

Subsequently, an oxide layer 7 is formed over the entire surface of the resultant structure by means of, for example, CVD and the resultant oxide layer is subsequently subjected to anisotropic etching by means of, for example, RIE so that the oxide layer is left on the side walls of the pedestal regions $3_{18}$ to $3_{27}$ as illustrated in FIGS. 4C and 5C. At this time electrode 5 extending from the substrate 1 to the isolation region 2 is covered with the oxide layer 7 so that it is not exposed. Thus, the gate electrode 5 is insulated from other conductive regions. If, in this state, the surface of the substrate 1 and the surfaces of the pedestal regions $3_{18}$ to $3_{24}$ are exposed, contact holes 8 can be formed on a self-alignment basis.

Subsequently, a contact hole (not shown) communicating with the contact area $5_1$ of the gate electrode 5 is formed in the oxide layer 7. Next, conductive layers which are in contact with the source/drain regions 6a and 6b is formed and then patterned in accordance with a predetermined wiring pattern. Subsequently, the entire surface of the resultant structure is covered with a surface protective film, whereby a MOS transistor according to the third embodiment is produced.

According to the third embodiment, a MOS transistor with higher current drivability and smaller surface area than those of the first and second embodiments can be produced.

In the case of the first, second and third embodiments described above, the contact holes for the source/drain diffusion layers 6a and 6b are formed using a self aligned process. However, the contact holes may be formed by a photoetching method using a photo resist, that is, by a masking process.

Hereinafter an example of the masking process for forming the contact holes will be described on the basis of the semiconductor device in accordance with the third embodiment.

Figure 6D:
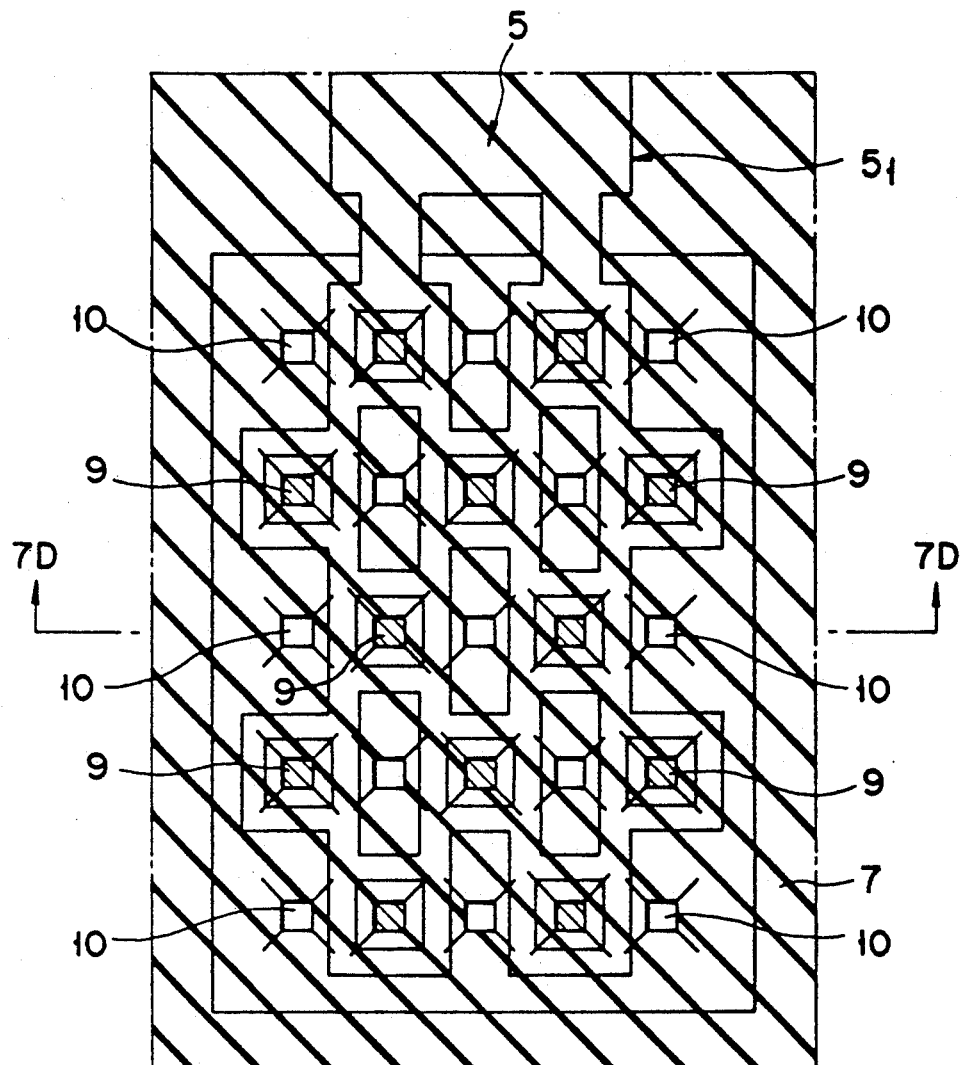
FIGS. 6D and 6E illustrate steps of manufacture of contact holes of a MOS transistor with improved current drivability of the present invention in accordance with mask alignment.
Figure 7D:
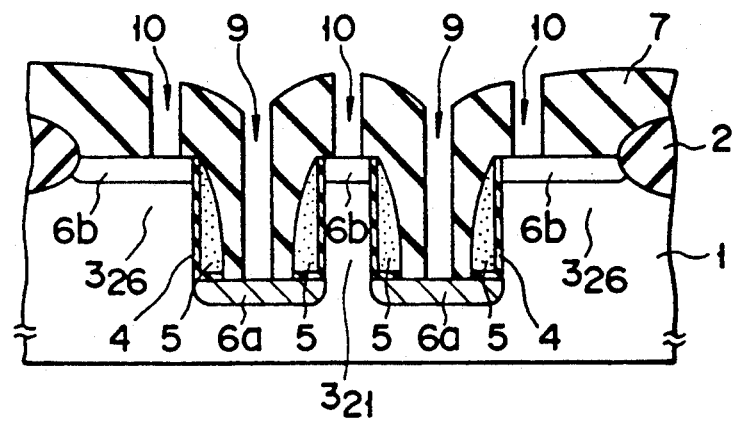
FIGS. 7D and 7E are cross-sectional views taken along lines 7D—7D and 7E—7E of FIGS. 6D and 6E, respectively.

First, as illustrated in FIGS. 6D and 7D, an oxide layer 7 is formed over the entire surface of a device which has been produced in accordance with the same steps as those used for producing the structure shown in FIGS. 6B and 7B by means of, for example, CVD. Subsequently, a contact hole 9 communicating with a source/diffusion layer 6a and a contact hole 10 communicating with a source/drain diffusion layer 6b are formed in the oxide layer 7 by means of a photoetching method using a photo resist. The contact holes 9 and 10 are alternately formed in alignment with one another. As can be seen from FIG. 6D, the contact holes 9 are in alignment with one another along a diagonal line and so are the contact holes 10. By arranging the contact holes 9 and 10 in this way, it becomes easy to arrange lines connected to the source/drain diffusion layers. At this point, a contact hole which communicates with the contact area $5_1$ of the gate electrode 5 may be formed in the oxide layer 7.

Figure 6E:
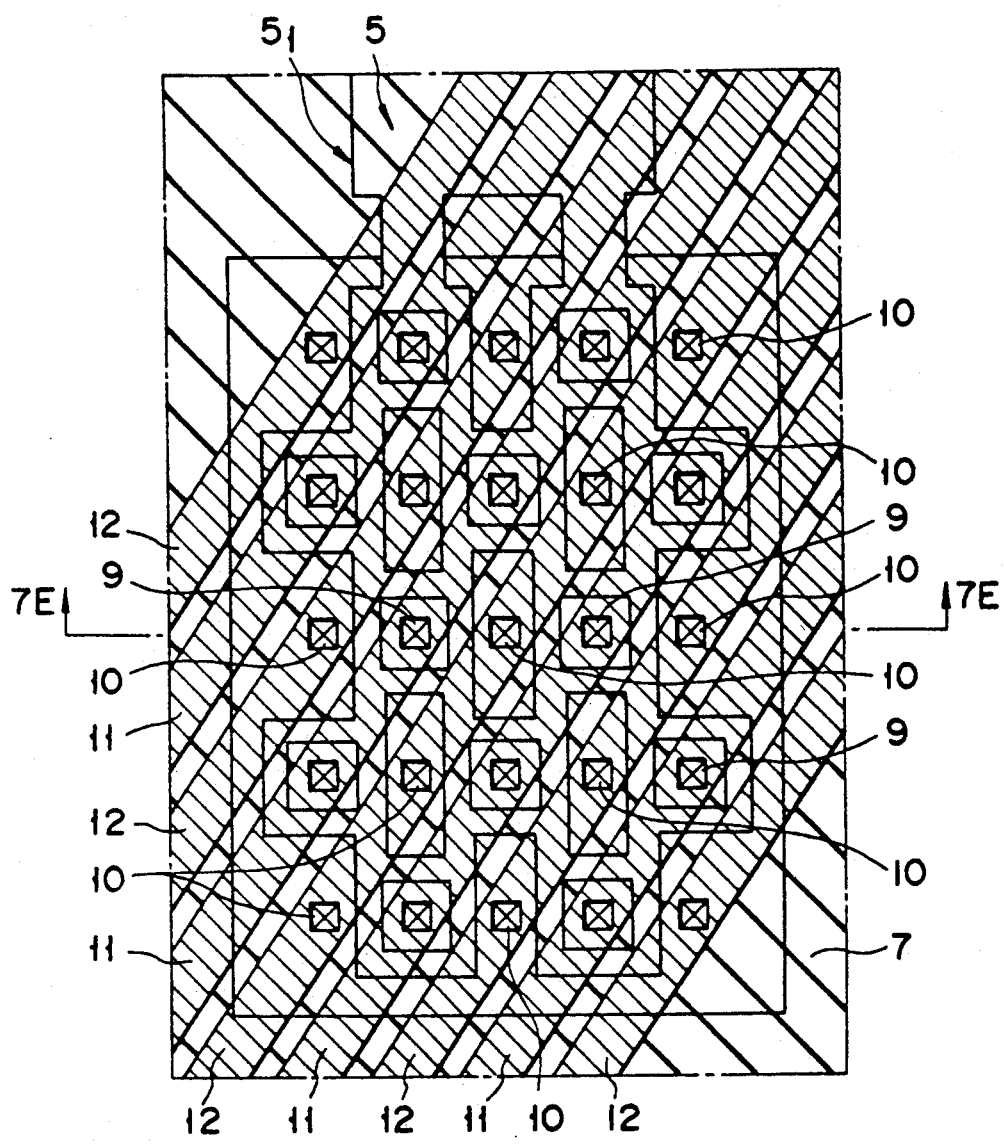
Figure 7E:
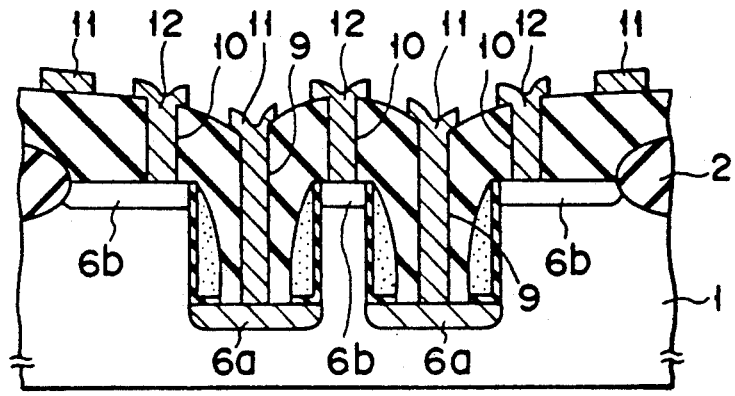
Figure 8:
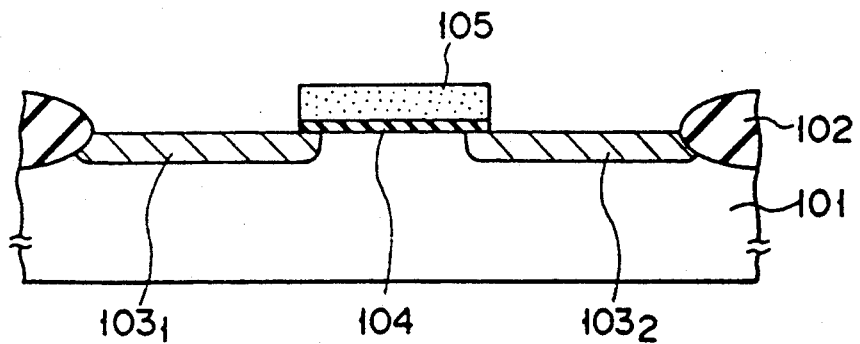
FIG. 8 is a cross-sectional view of a conventional MOS transistor.
Figure 9:
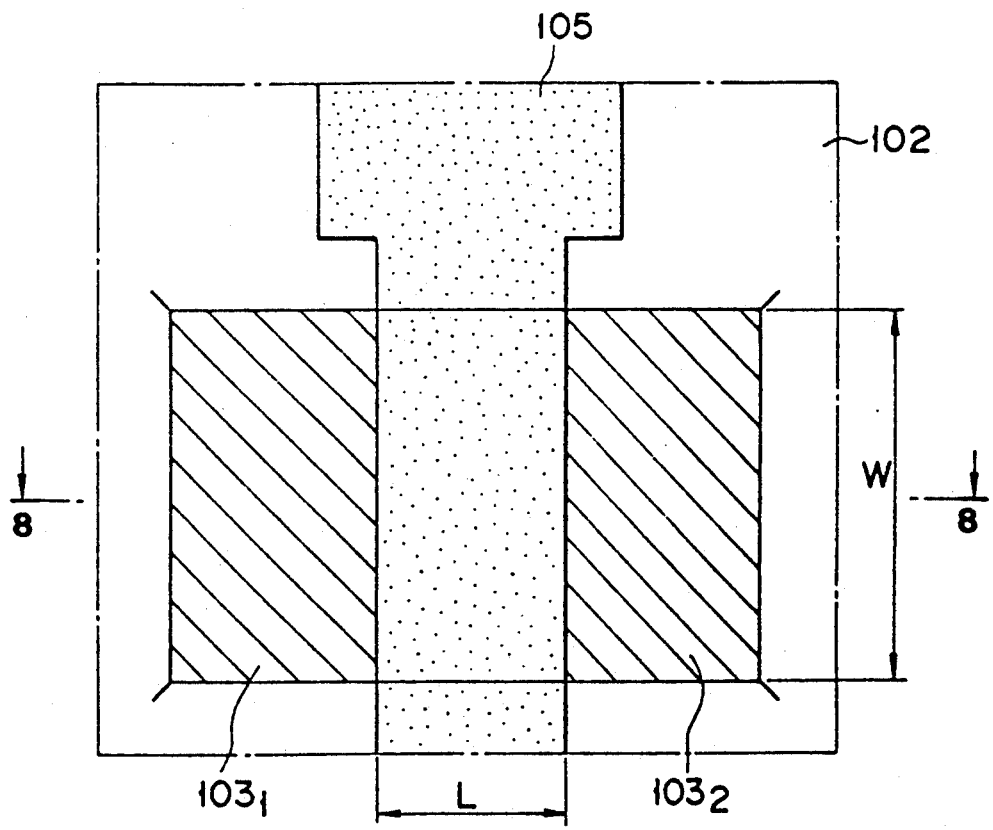
FIG. 9 is a plan view of the MOS transistor of FIG. 8.

Subsequently, as illustrated in FIGS. 6E and 7E, aluminum is deposited over the entire surface of the resultant structure by means of, for example, sputtering. Subsequently, the layer of aluminum is patterned with the result that metal lines 11 which contact the source/drain diffusion layers 6a through the contact holes 9 and metal lines 12 which contact the source/drain diffusion layers 6b through the contact holes 10 can be formed. The metal lines can be formed by a single layer of aluminum.

In the first through third embodiments, a MOSFET is produced. Alternatively, a MESFET which is formed on a GaAs substrate may be produced. In this case, of course, there is no need for a gate insulating layer. Also, since GaAs itself is semi-insulating, an isolation region which is represented by a field insulating layer need not necessarily be formed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device with a field effect transistor comprising:
    a semiconductor substrate having a plurality of pedestal regions, each pedestal region consisting of a first surface located at the surface of the substrate, a second surface which differs in height from said first surface, and side surfaces connecting said first and second surfaces together, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$;
    a first region formed in each first surface of each pedestal region of said semiconductor substrate and abutting each side surface of each pedestal region and second regions formed in said second surfaces, said first region and said second regions serving as source and drain regions and formed of a conductivity type being opposite to a conductivity type of said semiconductor substrate; and
    gate electrodes formed on the side surfaces of said pedestal regions, the gate electrodes being connected together.

2. A device according to claim 1, wherein the minimum width of said pedestal regions is LB and the width of a depletion region formed in each of said pedestal regions is xj, the minimum pedestal region width LB and the depletion region width xj are related such that $LB \leq 2xj$.

3. A semiconductor device with an insulated gate transistor comprising:
- a plurality of pedestal regions having side walls formed on a semiconductor substrate, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$, said pedestal regions and said semiconductor substrate having the same conductivity type;
- insulating layers formed on said side walls of said pedestal regions;
- gate electrodes formed on said insulating layers and connected together; and
- a first region formed within said semiconductor substrate and adjoining the side walls of each pedestal region and second regions formed within top portions of said pedestal regions, said first region and said second regions serving as source and drain regions, said first and second regions having a conductivity type opposite to the conductivity type of said semiconductor substrate.

4. A device according to claim 3, wherein the minimum width of said pedestal regions is LB and the width of a depletion region formed in each of said pedestal regions is xj, the minimum pedestal region width LB and the depletion region width xj are related such that $LB \leq 2xj$.

5. A semiconductor device with an insulated gate transistor comprising:
- a semiconductor substrate having a concavity, said concavity having a top and a bottom region;
- a plurality of pedestal regions formed at the bottom region of said concavity, said pedestal regions having side surfaces and having the same conductivity type as said semiconductor substrate, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$;
- insulating layers formed on the side surfaces on said pedestal regions;
- gate electrodes formed on said insulating layers and connected together; and
- a first region formed in said semiconductor substrate at the bottom region of the concavity and abutting the side surfaces of said pedestal regions and second regions formed within top portions of said pedestal regions, said first and second regions serving as source and drain regions, and having a conductivity type opposite to the conductivity type of said semiconductor substrate.

6. A device according to claim 1, wherein the minimum width of said pedestal regions is LB and the width of a depletion region formed in each of said pedestal regions is xj, the minimum pedestal region width LB and the depletion region width xj are related such that $LB \leq 2xj$.

7. A device according to claim 1, wherein insulating layers are formed on the side surfaces of the concavity of said semiconductor substrate, gate electrodes are formed on the insulating layers formed on said side surfaces of said concavity and connected to the gate electrodes formed on said side surfaces of said pedestal regions, said first region abutting said side surfaces of said concavity and said second regions formed on a tip of the top region of said concavity.

8. A device according to claim 5, wherein said first region is connected to a first conductive layer and said second regions are connected together by a second conductive layer.

9. A device according to claim 8, wherein said first and second conductive layers are arranged diagonally with respect to the rows in which said pedestal regions are arranged.

10. A field effect transistor comprising:
- a semiconductor substrate having a plurality of pedestal regions, each pedestal region consisting of a first surface located at the surface of the substrate, a second surface which differs in height from said first surface, and side surfaces connecting said first and second surfaces together, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$;
- a first region formed in each first surface of each pedestal region of said semiconductor substrate and abutting each side surface of each pedestal region and second regions formed in said second surfaces of said semiconductor substrate, said first region and said second regions serving as source and drain regions and formed of a conductivity type being opposite to a conductivity type of said semiconductor substrate; and
- gate electrodes formed on the side surfaces of said pedestal regions, the gate electrodes being connected together.

11. A field effect transistor according to claim 10, wherein the minimum width of said pedestal regions is LB and the width of a depletion region formed in each of said pedestal regions is xj, the minimum pedestal region width LB and the depletion region width xj are related such that $LB \leq 2xj$.

12. An insulated gate transistor comprising:
- a plurality of pedestal regions having side walls formed on a semiconductor substrate, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$, said pedestal regions and said semiconductor substrate having the same conductivity type;
- insulating layers formed on said side walls of said pedestal regions;
- gate electrodes formed on said insulating layers and connected together; and a first region formed within said semiconductor substrate and adjoining the side walls of each pedestal region and second regions formed within top portions of said pedestal regions, said first region and said second regions serving as source and drain regions, said first and second regions having a conductivity type opposite to the conductivity type of said semiconductor substrate.

13. An insulated gate transistor according to claim 12, wherein the minimum width of said pedestal regions is LB and the width of a depletion region formed in each of said pedestal regions is xj, the minimum pedestal region width LB and the depletion region width xj are related such that $LB \leq 2xj$.

14. An insulated gate transistor comprising:
a semiconductor substrate having a concavity, said concavity having a top and a bottom region;
a plurality of pedestal regions formed at the bottom region of said concavity, said pedestal regions having side surfaces and having the same conductivity type as said semiconductor substrate, said pedestal regions being arranged in rows, said pedestal regions in each row being arranged at intervals of LD, said rows being arranged at intervals of LE, and said gate electrodes have a thickness of LF, the intervals LD and LE and the thickness LF being related such that $LD \geq 2LF \geq LE$;
insulating layers formed on the side surfaces on said pedestal regions;
gate electrodes formed on said insulating layers and connected together; and
a first region formed in said semiconductor substrate at the bottom region of the concavity and abutting the side surfaces of said pedestal regions and second regions formed within top portions of said pedestal regions, said first and second regions serving as source and drain regions, and having a conductivity type opposite to the conductivity type of said semiconductor substrate.

15. An insulated gate transistor according to claim 14, wherein the minimum width of said pedestal regions is LB and the width of a depletion region formed in each of said pedestal regions is xj, the minimum pedestal region width LB and the depletion region width xj are related such that $LB \leq 2xj$.

16. An insulated gate transistor according to claim 14, wherein insulating layers are formed on the side surfaces of the concavity of said semiconductor substrate, gate electrodes are formed on the insulating layers formed on said side surfaces of said concavity and connected to the gate electrodes formed on said side surfaces of said pedestal regions, said first region abutting said side surfaces of said concavity and said second regions formed on a tip of the top region of said concavity.

17. An insulated gate transistor according to claim 14, wherein said first region is connected to a first conductive layer and said second regions are connected together by a second conductive layer.

18. An insulated gate transistor according to claim 17, wherein said first and second conductive layers are arranged diagonally with respect to the rows in which said pedestal regions are arranged.

* * * * *